United States Patent

Laxman et al.

Patent Number: 5,492,736
Date of Patent: Feb. 20, 1996

[54] FLUORINE DOPED SILICON OXIDE PROCESS

[75] Inventors: Ravi K. Laxman, Encinitas; Arthur K. Hochberg, Solana Beach; David A. Roberts, Escondido; Raymond N. Vrtis, LaCosta, all of Calif.

[73] Assignee: Air Products and Chemicals, Inc., Allentown, Pa.

[21] Appl. No.: 345,158

[22] Filed: Nov. 28, 1994

[51] Int. Cl.$^6$ .................................................. H05H 1/24
[52] U.S. Cl. ................ 427/579; 252/182.15; 252/182.3; 427/255.3; 427/294; 427/574; 427/585; 428/688; 556/467; 556/474; 556/476; 556/487
[58] Field of Search .................................. 427/579, 255.3, 427/294, 574, 585; 428/688; 556/467, 474, 476, 487; 252/182.15, 182.3

[56] References Cited

U.S. PATENT DOCUMENTS 5,268,202  12/1993  You et al. ............................ 427/255

OTHER PUBLICATIONS

T. Homma, et al., J. Electrochem. Soc., Mar. 1993, vol. 140, No. 3, pp. 687–692.
T. Homma, et al., J. Electrochem. Soc., 1993, vol. 140, No. 3, pp. 3599–3603; (No month avail.).
T. Usami, et al., Jpn. J. Appl. Phys., Part 1, 1993, vol. 33, No. 1B, pp. 408–412; (No month avail.).
C. Falcony, et al., Thin Solid Films, Apr. 1991, vol. 199, No. 2, pp. 269–278.
C. Falcony, et al., J. Vac. Sci. Technol. A, Vac. Surf. Films, Nov. 1993, vol. 11, No .6, pp. 2945–2949.
S. E. Johnson, et al., Inorganic Chemistry, 1989, vol. 28, No. 16, p. 3183(h); (No month avail.).
M. Voronkov, et al., J. Organomet. Chem. 1990, 389(1), pp. 1–22; (No month avail.).
M. Anand, et al., 1994 VMIC Conference; 1994 ISMIC —103/94/0015; (No month avail.).
T. Fukada, et al., 1993 International Conf. on Solid State Devices and Materials, Makuhan, 1993, (No month avail.). pp. 158–160.

*Primary Examiner*—Bernard Pianalto
*Attorney, Agent, or Firm*—Geoffrey L. Chase

[57] ABSTRACT

The present invention is a process for forming a fluorine-containing silicon oxide film on a substrate by plasma-enhanced chemical vapor deposition using a fluorinated silicon source of the formula:

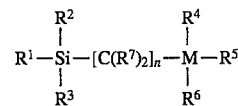

wherein at least one of $R^1-R^6$ is fluorine and the remaining R groups are independently H, F, non-fluorinated-, partially fluorinated- or perfluorinated-: alkyl, alkenyl, alkynyl, aryl or benzylic groups, or $C_xH_{2x}$ when one or more of $R^1$, $R^2$ or $R^3$ is connected to $R^4$, $R^5$ or $R^6$ through a bridging group $C_yH_{2y}$; where x is 1–6, and y is 0–6; where M is Si or C and n is 0–6 and $R^7$ is independently H, F, $C_zH_{2z+1}$ where z is 1–6 or $C_rH_sF_t$ where r is 1–6, s is (2r+1–t); t is 1 to (2r+1). The present invention is also the film formed by that process and several novel source materials used in the process.

15 Claims, 1 Drawing Sheet

FLUORINE DOPED SILICON OXIDE PROCESS

FIELD OF THE INVENTION

The present invention is directed to a process for forming fluorine-containing silicon oxide films on electronic material substrates to achieve lower dielectric constants than in pure silicon dioxide using a class of fluorinated alkyl silanes to appropriately control the fluorine content of such films and thus the dielectric constant of such films.

BACKGROUND OF THE INVENTION

The semiconductor industry is rapidly decreasing the dimensions and increasing the density of circuitry and electronic components in silicon chips and integrated circuits. In addition, integrated circuits are being layered or stacked with ever decreasing insulating layer thickness between each circuitry layer.

With these decreasing geometries and device sizes, the semiconductor industry has sought to avoid parasitic capacitance and crosstalk noise caused by inadequate insulating layers in the integrated circuits. As operation frequencies approach the GHz regime, low RC (resistance x capacitance) delay constants become essential. One way to achieve the desired low RC delay constants involves use of dielectric material in insulating layers that have a low dielectric constant.

T. Homma, et al., J. Electrochem. Soc., 3/93, vol. 140, No. 3, pp.687–92, discloses the room temperature chemical vapor deposition of SiOF films for interlayers in submicron multilevel interconnections. The technique uses T. Homma, et al., J. Electrochem. Soc., 1993, Vol. 140, fluorotriethoxysilane and water vapor as source materials. No. 12, pp. 3599–603, discloses the characteristics of SiOF films from various alkoxysilane precursors for interlayer dielectrics in multilevel interconnections.

The articles by T. Homma, et al. have attempted to deposit SiOF from various alkoxyfluorosilanes under an atmospheric pressure chemical vapor deposition process with water as a catalyst. The atomic fluorine percentage is limited in these precursors and volatility of the sources is very low. Films obtained by this process have poor uniformity and contain water.

T. Usami, et al., Jpn. J. Appl. Phys., Part 1, 1993, vol. 33, No. 1B, pp 408–12, report an interlayer dielectric film using fluorine-doped silicon oxide for multilevel interconnection of very large scale integration (VLSI). The film is deposited from hexafluoroethane and tetraethoxysilane using plasma-enhanced chemical vapor deposition. Low dielectric constants are reported to be caused by the Si-F bond formation and SiOF films are reported to have very high applicability as an interlayer dielectric film for advanced VLSI devices. Usami, et al. have deposited SiOF using tetraethoxysilane and hexafluoroethane. Here, more than one source is required to obtain the desired SiOF films, and the vapor pressure of tetraethoxysilane is low.

C. Falcony, et al., Thin Solid Films, 4/91, vol. 199, No. 2, pp269–78, describes the deposition of silicon dioxide films by plasma-enhanced chemical vapor deposition using $SiCl_4$ and $SiF_4$.

C. Falcony, et al., J. Vac. Sci. Technol. A, Vac. Surf. Films, 11/93, vol. 11, no. 6, pp. 2945–9, discloses high quality silicon dioxide films deposited by plasma-enhanced chemical vapor deposition using $SiF_4$ and $N_2O$. Hydrogen is used to decrease the amount of residual F in the oxide.

Falcony, et al. have used silicon tetrafluoride as a precursor. Silicon tetrafluoride is a highly toxic compressed gas and is hazardous to handle.

U.S. Pat. No. 5,268,202 describes the deposition of low dielectric interlayers for electronic devices and modules using fluorinated parylene.

S. E. Johnson, et al., Inorganic Chemistry, 1989, Vol. 28, No. 16, p. 3183(h), discloses the synthesis of $F_3SiCH_2CH_2CH_2SiF_3$.

M. Voronkov, et al., J. Organomet. Chem. 1990, 389(1), PP 1–22, discloses the compositions: $FMe_2SiCH_2CH_2SiMe_2F$ and $F_2MeSiCH{:}CHSiMeF_2$.

The prior art has attempted to provide insulating layers of silicon dioxide and fluorinated silicon dioxide from various precursors or sources which under appropriate conditions decompose to provide such layers. However, the prior art processes suffer from difficult handling of precursors, lack of volatility of sources or precursors, safety, as well as an inability to adjust the fluorine level in silicon oxide layers to provide the appropriate fluorine content in such fluorinated silicon oxide layers. These and other problems in the prior art are overcome by the present invention, as will be set forth in greater detail below.

BRIEF SUMMARY OF THE INVENTION

The present invention is a process for forming a fluorine-containing silicon oxide film on a substrate by plasma-enhanced chemical vapor deposition using a fluorinated silicon source of the formula:

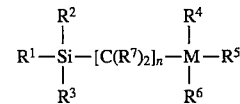

wherein at least one of $R^1$–$R^6$ is fluorine and the remaining R groups are independently H, F, non-fluorinated-, partially fluorinated- or perfluorinated-: alkyl, alkenyl, alkynyl aryl or benzylic groups, or $C_xH_{2x}$ when one or more of $R^1$, $R^2$ or $R^3$ is connected to $R^4$, $R^5$ or $R^6$ through a bridging group $C_yH_{2y}$; where x is 1–6 and y is 0–6; where M is Si or C and n is 0–6; and $R^7$ is independently H, F, $C_zH_{2z+1}$ where z is 1–6 or $C_rH_sF_t$ where r is 1–6, s is (2r+1–t), and t is 1 to (2r+1).

Preferably, at least one of $R^1$–$R^6$ is fluorine and t remaining R groups are independently H, F, $C_xH_{2x+1}$, $C_rH_sF_t$, $C_6H_5$, or $C_xH_{2x}$ when one or more of $R^1$, $R^2$ $R^3$ is connected to $R^4$, $R^5$ or $R^8$ through a bridging group $C_yH_{2y}$; where x is 1–6 r is 1–6, s is (2r+1–t); t is 1 to (2r+1) and y is 0–6.

Preferably, the fluorinated silicon source is a composition of the formula:

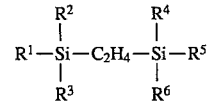

wherein at least one of $R^1$–$R^8$ is fluorine and the remaining R groups are independently H, F, $C_xH_{2x+1}$, $C_rH_sF_t$, where x is 1–6, r is 1–6, s is (2r+1–t), and t is i to (2r+1).

More preferably, the fluorinated silicon source is selected from the group consisting of: $FSi(C_2H_5)_3$; $F_2Si(C_2H_5)_2$; $F_2Si(CH_3)CH_2CH_2CH_2Si(CH_3)F_2$; $F_2SiCH_2CH_2CH(SiF_3)C_2H_5$; $F_3Si{-}(CH_2)_u{-}SiF_3$ where u is 1–6; and FSiR$_2$H where R is C$_1$–C$_6$ hydrocarbons or mixtures thereof.

The fluorine-containing silicon oxide film formed comprises SiO$_p$F$_q$, wherein p=2-q and q=0.03–0.6.

An oxygen containing compound selected from the group consisting of N$_2$O, O$_3$ and O$_2$ is utilized as a reactant in the plasma-enhanced chemical vapor deposition. Preferably, oxygen is present in a ratio of 0.5:1 or greater of said fluorinated silicon source.

Preferably, the plasma-enhanced chemical vapor deposition is conducted at a temperature in the range of approximately 50 to 500° C., a pressure of approximately 200 mTorr to 2 Torr, and a plasma power of approximately 0.25 to 2 watts/cm$^2$.

Preferably, the fluorinated silicon source is introduced into said plasma-enhanced chemical vapor deposition by a process selected from the group consisting of entrainment in an inert carrier gas, vaporization and direct liquid injection.

Optionally, the fluorinated silicon source can be utilized in combination with other silicon dioxide sources.

More specifically, the present invention is a process for forming a fluorine-containing silicon oxide film on a substrate by plasma-enhanced chemical vapor deposition using a fluorinated silicon source, comprising the steps of:

(a) establishing a plasma by appropriate conditions in a chemical vapor deposition reactor charged with a substrate be coated;

(b) introducing a fluorinated silicon source and an oxygen containing compound into the reactor;

(c) reacting the fluorinated silicon source with the oxygen containing compound to produce a chemical vapor deposited fluorinated silicon oxide film on the substrate, wherein the fluorinated silicon source has the formula:

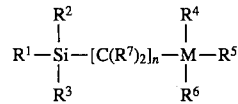

wherein at least one of R$^1$–R$^6$ is fluorine and the remaining R groups are independently H, F, non-fluorinated-, partially fluorinated-or perfluorinated-: alkyl, alkenyl, alkynyl aryl or benzylic groups, or C$_x$H$_{2x}$ when one or more of R$^1$, R$^2$ or R$^3$ is connected to R$^4$, R$^5$ or R$^6$ through a bridging group C$_y$H$_{2y}$; where x is 1–6, and y is 0–6; where M is Si or C and n is 0–6; and R$^7$ is independently H, F, C$_z$H$_{2z+1}$ where z is 1–6 or C$_r$H$_s$F$_t$ where r is 1–6, s is (2r+1-t); t is 1 to (2r+1).

The present invention is also a fluorine-containing silicon oxide film supported on a substrate comprising SiO$_p$F$_q$, wherein p=2-q and q=0.03–0.6, produced by plasma-enhanced chemical vapor deposition using a fluorinated silicon source of the formula:

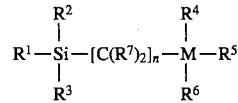

wherein at least one of R$^1$–R$^6$ is fluorine and the remaining R groups are independently H, F, non-fluorinated-, partially fluorinated- or perfluorinated-: alkyl, alkenyl, alkynyl aryl or benzylic groups, or C$_x$H$_{2x}$ when one or more of R$^1$, R$^2$ or R$^3$ is connected to R$^4$, R$^5$ or R$^6$ through a bridging group C$_y$H$_{2y}$; where x is 1–6, and y is 0–6; where M is Si or C and n is 0–6; and R$^7$ is independently H, F, C$_z$H$_{2z+1}$ where z is 1–6 or C$_r$H$_s$F$_t$ where r is 1–6, s is (2r+1-t); t is 1 to (2r+1).

Typically, the film has an index of refraction less than approximately 1.41 at 632 nm.

The present invention is also a composition of matter comprising F$_2$Si(CH$_3$)CH$_2$CH$_2$Si(CH$_3$)F$_2$.

The present invention is further a composition of matter comprising F$_3$SiCH$_2$CH$_2$CH$_2$CH(SiF$_3$)C$_2$H$_5$.

DETAILED DESCRIPTION OF THE INVENTION

Figure 1:
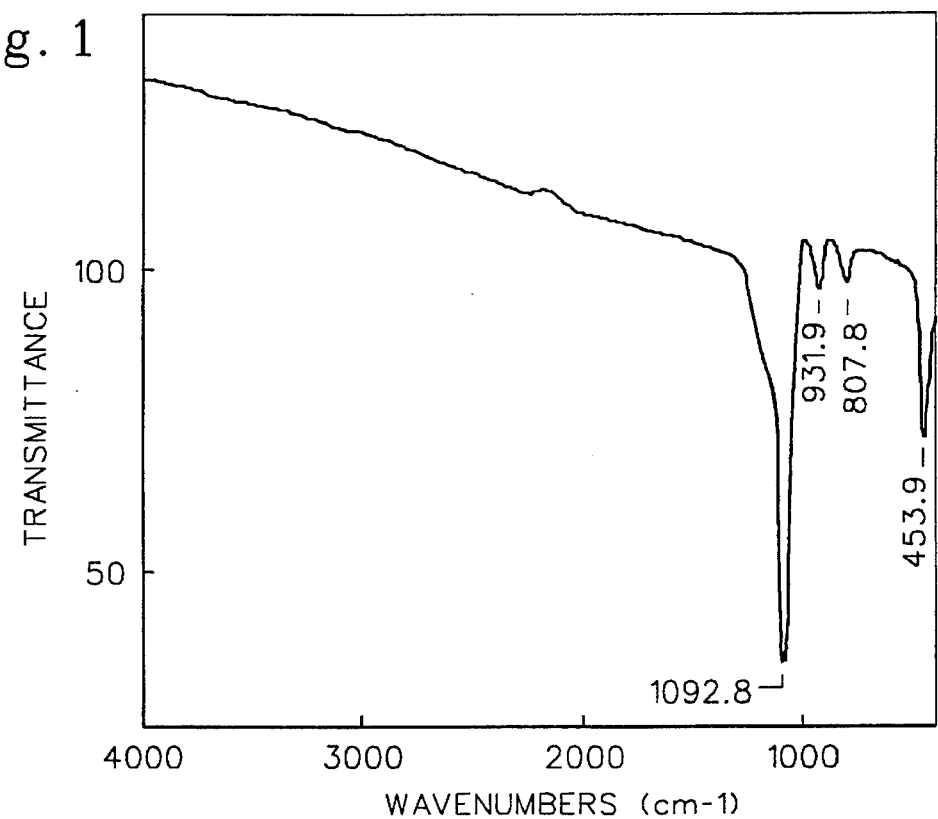
FIG. 1 is a graph of the Fourier Transform Infra-Red spectrum of the SiO$_p$F$_q$ layer of Example 2.

The invention involves deposition of SiO$_p$F$_q$ films, where p=2-q and q=0.03–0.6, using a single source or precursor having fluorine and carbon functionality bonded directly to the silicon of the source, optionally with the codeposition of other silicon oxide sources or precursors. In the codeposition option, the multiple sources can be mixed in the bubbler container, the conduit supplying the reactor or in the reactor itself. The deposited films have silicon, oxygen and fluorine content. FIG. 1 shows a Fourier Transform Infra-Red (FT-IR) spectrum after annealing at 350° C. of the film of Example 2 indicating the presence of Si-F bonds at 930 cm$^{-1}$ and the absence of any C-H bonds in the area of 3000 cm$^{-1}$.

Figure 2:
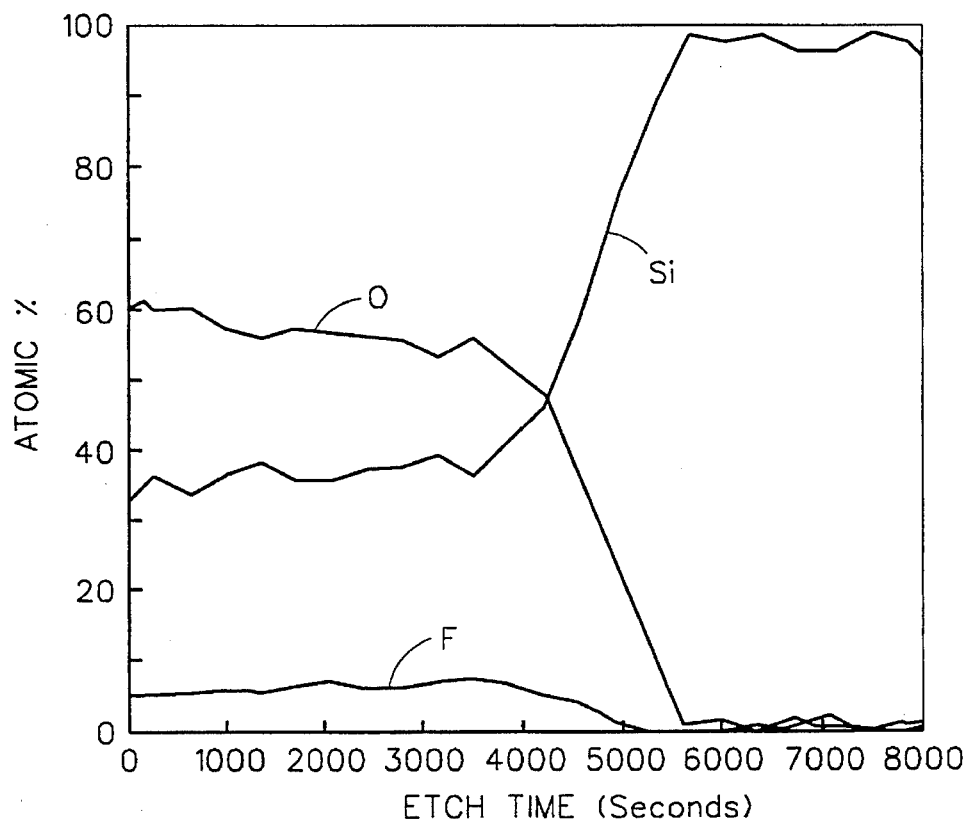
FIG. 2 is a graph of depth X-ray photoelectron spectroscopy of the SiO$_p$F$_q$ layer of Example 2.

FIG. 2 shows a depth X-ray photoelectron spectroscopy of the SiO$_p$F$_q$ layer of Example 2 indicating a consistent silicon, fluorine and oxygen content as the layer is etched, until the layer is consumed at the point of inflection which indicates the silicon substrate under the layer. FIG. 2 also shows no detectable carbon content. In order to obtain a desirable fluorine concentration, a variety of fluorinated silicon sources are contemplated with a range of fluorine concentrations built into the source molecule or multiple fluorinated silicon source can be used simultaneously or codeposited.

The process of the present invention uses a fluorinated silicon source of the formula:

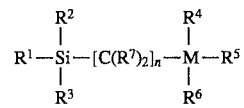

wherein at least one of R$^1$–R$^6$ is fluorine and the remaining R groups are independently H, F, non-fluorinated-, partially fluorinated- or perfluorinated-: alkyl, alkenyl, alkynyl. aryl or benzylic groups, or C$_x$H$_{2x}$ when one or more of R$^1$, R$^2$ or R$^3$ is connected to R$^4$, R$^5$ or R$^6$ through a bridging group C$_y$H$_{2y}$; where x is 1–6, and y is 0–6; where M is Si or C and n is 0–6; and R$^7$ is independently H, F, C$_z$H$_{2z+1}$ where z is 1–6 or C$_r$H$_s$F$_t$ where r is 1–6, s is (2r+1-t); t is 1 to (2r+1).

Particular organic R groups can include; methyl, ethyl, vinyl, propyl, butyl, pentane, hexyl, cyclohexyl, phenyl and mixtures thereof, which can individually be non-fluorinated, partially fluorinated or perfluorinated, ie., fluorine saturated. The organic R groups can be normal or branched such as in an iso or tertiary structure and may have substituents such as alkyl-, alkenyl- or alkynyl- substituted aryl or aryl substituted alkyl-, alkenyl-, or alkynyl.

Preferably, at least one of R$^1$–R$^6$ is fluorine and the remaining R groups are independently H, F, C$_x$H$_{2x+1}$, C$_r$H$_s$F$_t$, C$_6$H$_5$, or C$_x$H$_{2x}$ when one or more of R$^1$, R$^2$ or R$^8$ is connected to $R^4$, $R^5$ or $R^6$ through a bridging group $C_yH_{2y}$; where x is 1–6, r is 1–6, s is (2r+1–t); t is 1 to (2r+1) and y is 0–6.

More preferably, the fluorinated silicon source is a composition of the formula:

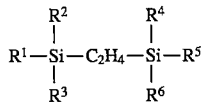

wherein at least one of $R^1$–$R^6$ is fluorine and the remaining R groups are independently H, F, $C_xH_{2x+1}$, $C_rH_sF_t$, where x is 1–6, r is 1–6, s is (2r+1–t), and t is 1 to (2r+1).

Particular examples of the fluorinated silicon source are: $FSi(C_2H_5)_3$; $F_2Si(C_2H_5)_2$; $F_2Si(CH_3)CH_2CH_2Si(CH_3)F_2$; $F_3SiCH_2CH_2CH(SiF_3)C_2H_5$; $F_3Si-(CH_2)_u-SiF_3$ where u is 1–6; and $FSiR_2H$ where R is $C_1$–$C_6$ hydrocarbons or mixtures thereof.

The above-identified sources of the present invention typically exhibit the following four advantages:

i) They are fluorinated-alkylsilanes which have very high vapor pressures and have direct silicon-fluorine and silicon-carbon bonds. The high vapor pressures of these compounds will help in easy delivery of the precursors into a chemical vapor deposition reactor;

ii) The atomic percent of fluorine in the films can be adjusted by an appropriate choice of the precurs or within the general formula, set forth above;

iii) These sources can be easily codeposited with other silicon dioxide sources in the bubbler, distribution system or reactor to optimize a) the amount of fluorine concentration in the deposited film, b) the quality of oxide (low impurities) and c) deposition rates and temperatures.

iv) These liquid sources are less hazardous than silicon tetrafluoride, which is a compressed gas.

Oxygen or an oxygen containing compound can be utilized as a reactant in the plasma-enhanced chemical vapor deposition. Oxygen containing compounds include $N_2O$, $O_8$ and $O_2$. The oxygen is present in a molecular ratio of 0.5:1 or greater of the fluorinated silicon source. The oxygen is present to provide oxygen for the oxygen content of the resulting $SiO_pF_q$ film, where p=2-q and q=0.03–0.6.

The plasma-enhanced chemical vapor deposition is conducted at a temperature in the range of approximately 50° to 500° C. a pressure of approximately 200 mTorr to 2 Torr, and a plasma power of approximately 0.25 to 2 watts/cm².

In one method of delivery, the fluorinated silicon source is introduced into the plasma-enhanced chemical vapor deposition reactor in an inert carrier gas, such as; nitro argon or helium. Inert gas is meant to be a carrier gas that does not adversely effect the reactions or formation of the fluorinated silicon oxide film. The inert carrier gas can be bubbled into a container or bubbler of the fluorinated silicon source material wherein the carrier gas entrains vapor of the source material and carries it to the reactor where the chemical vapor deposition takes place. Alternatively, a container of the source material can be connected to the reactor and the vapor pressure of the source material can be used to convey the source material to the reactor. Because of the cooling that will inherently occur as the source material evaporates, it may be desireable to heat the source material or container to assist in maintaining the vapor pressure of the source material. It is also possible to provide the source to the reactor by direct liquid injection. When multiple sources are utilized for codeposition the sources can be mixed in the bubbler, the distribution or delivery system or in the reactor itself.

Optionally, the fluorinated silicon source is utilized in combination with other silicon sources. For the purpose of the present invention, a silicon source or precursor is a compound which individually or in combination with other reactants can produce a silicon oxide film with the desired content of fluorine, ie., $SiO_pF_q$, where p=2-q, q=0.03–0.6, under the conditions of the reaction or decomposition set forth herein, which is preferably a plasma-enhanced chemical vapor deposition. The fluorinated silicon source has fluorine incorporated into the source molecule. Different fluorinated silicon sources can be used in combination (codeposition) to provide the desired film. In addition, fluorinated silicon sources may be codeposited with unfluorinated silicon source materials to provide the appropriate fluorine content or to adjust other properties of the produced films.

The designation $SiO_pF_q$, as defined above, is an average value for the fluorine content found in the films which would otherwise be a silicon dioxide film without the fluorine doping. It is possible that isolated positions of the film may have a value of $SiO_2$, but by overall analysis of the film by infra-red spectrometry, the average fluorine content spans the range of one to twenty atomic percent of the $SiO_pF_q$ film.

For the purposes of the present invention using fluorinated silicon sources of the class of fluoroakylsilanes and disilanes, the preferred silanes are the primary silanes which are more reactive and volatile at lower temperatures, followed by the secondary silanes and then the tertiary silanes. With regard to the disilanes, it is preferred to have a structure in which the two silicon atoms are bridged by an ethylene group, ie., $-CH_2CH_2-$.

The plasma enhanced chemical vapor deposition (PECVD) of silicon oxyfluoride ($SiO_pF_q$) films was carried out using a liquid source and oxygen as a reactive gas. Oxygen and vapors of the source are introduced into the reactor. Source material is introduced at 10–200 sccm and $O_2$ is introduced at between 10 and 200 sccm into the reactor. A heating element was maintained between 100° and 600° C., and the total pressure of the reactor was between 100mT and 2Torr. Plasma power was maintained between 50 to 100 watts of power by a plasma generating system. The $SiO_pF_q$ deposition rates obtained using these conditions are between 50 and 250 angstroms per minute and exhibit an index of refraction of between 1.377 and 1.406. These indices of refraction increase with time (several hours) when exposed to air. No deposition of $SiO_pF_q$ films was observed using 18 sccm of 1,2 bis(methyldifluorosilyl) ethane and 100 sccm $O_2$ at a total pressure of 750 mTorr and 550° C. without plasma assistance.

The substrate on which the fluorine-containing silicon oxide film can be any of a number of electronic materials which require a barrier layer. Such substrates can include silicon oxides, silicon dioxide, intermetallic layers, titanium nitride and silicon nitride. A preferred substrate would be one with metal patterns and the deposited $SiO_pF_q$ film of the present invention would be an intermetallic dielectric layer.

The process of the present invention for forming a fluorine-containing silicon oxide film on a substrate by plasma-enhanced chemical vapor deposition using a fluorinated silicon source, comprises the following steps:

(a) establishing a plasma by appropriate conditions in a chemical vapor deposition reactor charged with a substrate to be coated;

(b) introducing a fluorinated silicon source and an oxygen containing compound into the reactor;

(c) reacting the fluorinated silicon source with the oxygen containing compound to produce a chemical vapor deposited fluorinated silicon oxide film on the substrate wherein the fluorinated silicon source has the formula set forth above.

In PECVD, a plasma, or glow discharge, is generated between two electrodes. There are two main types of plasmas used in the microelectronics industry; DC and rf. In the IDC plasma a fixed voltage differential between the two electrodes is used to generate the plasma, this type of plasma is generally used for the sputtering of films from the target electrode onto the grounded electrode. In the rf-plasma the voltage on the two electrodes is switched at a specified frequency. This frequency is generally 13.56 mega-hertz, as assigned by the Federal Communications Commission. The rf-plasma is generally used for plasma enhanced chemical vapor deposition (PECVD) as well as for plasma etching. The use of PECVD generally allows for lower processing temperatures by activation of the reactive species. A PECVD process involves four basic steps:

(1) The primary reactions occur between the electrons, which are abundant in a glow discharge, and the reactants to form both ions and free radicals.
(2) The reactive species are transported to the substrate surface in parallel due to the oscillating electric field. There are also elastic and inelastic collisions with neutral radicals and molecules in the gas phase.
(3) The reactive species are adsorbed (radical adsorption) on the substrate.
(4) A rearrangement process occurs amongst the adsorbed reactive species or their reaction products and incorporate into a growing film. Some of these species may desorb back into the gas phase, these could be byproducts.

PECVD is used in a variety of applications such as silicon dioxide, silicon nitride, polysilicon and metal layers. PECVD is utilized both in semiconductor devices and also in solar cell manufacture.

The Vactronics Model PECVD-2000-M was used in the experiments of the present invention and constitutes a single wafer LPCVD reactor with a load-lock system to reduce exposure of the process chamber to the air. The system can be used to deposit films with and without plasma assistance at temperatures up to 600° C. The system is capable of handling wafers up to 150 mm in diameter. Gas and vapor supplies are fed from an exhausted source cabinet outside of the cleanroom. Wafers are sent from the load-lock through a slit-valve to the process chamber.

The source reactants, particularly the novel compositions 1,2 bis(methyldifluorosilyl) ethane, $F_2Si(CH_3)CH_2CH_2Si(CH_3)F_2$, and 1,4 bis(trifluorosilyl)hexane, $F_3SiCH_2CH_2CH_2CH(SiF_3)C_2H_5$, are synthesized as described below. These compounds, as well as other fluoroalkyl-silanes or disilanes, were synthesized by the reaction of the corresponding chloroalkyl-silane or disilane with 70% hydrogen-fluoride pyridine adduct. The reagent 70% hydrogen-fluoride pyridine was purchased commercially. There is no solvent required in this synthesis and the reaction is carried out at room temperature under an atmosphere of nitrogen.

The chloroalkyl-silane or disilane is placed in a two neck round bottom flask equipped with a cooling water condenser and a rubber septum. The round bottom flask is placed in a constant temperature bath at 27°–30° C. Seventy percent hydrogen-fluoride pyridine is added slowly (approximately 2 ml/5 min) using a syringe through the rubber septum. The reaction mixture is vigorously stirred during the addition. A white insoluble precipitate is formed as the reaction proceeds to completion. After the completion of addition, the reaction mixture is stirred for an additional period of two hours. The desired fluoroalkyl-silane or disilane is then purified by distillation under vacuum. Yields were typically in the range of 85–90%.

The plasma enhanced chemical vapor deposition (PECVD) of silicon oxyfluoride ($SiO_pF_q$) films using either difluorodiethyl silane or 1,2-bis(methyldifluorosilyl)ethane as liquid sources and oxygen as a reactive gas was carried out as set forth in the following examples.

EXAMPLE 1

The deposition of $SiO_pF_q$ films from difluorodiethyl silane and $O_2$ was carried out by flowing vapors of difluorodiethy silane into the reactor at between 11 and 18 sccm, flowing $O_2$ into the chamber at between 5 and 8 sccm, while maintaining the heating element at between 345° and 400° C., the total pressure between 780 and 1000 mTorr and supplying between 73 to 100 watts of power to the plasma generating system. The deposition rate of the $SiO_pF_q$ film deposited using 18 sccm difluorodiethyl silane, 8 sccm $O_2$, heater temperature 400° C., total pressure 800 mTorr, and plasma power of 100 W was 33 angstroms per minute and the resulting film had an index of refraction of 1.410.

EXAMPLE 2

When depositing $SiO_pF_q$ films from 1,2 bis(methyldifluorosilyl)ethane, the source bubbler was maintained at 35° C. in order to increase the vapor pressure of the source material. The deposition of $SiO_pF_q$ films from 1,2 bis(methyldifluorosilyl) ethane and $O_2$ was carried out by flowing vapors of 1,2 bis(methyldifluorosilyl)ethane into the reactor at 18 sccm, flowing $O_2$ into the chamber at between 8 and 100 sccm, while maintaining the heater element at between 550° and 100° C., the total pressure at between 500 and 750 mTorr while supplying between 40 and 100 Watts of power to the plasma apparatus. The deposition rates obtained using these conditions are between 89 and 248 angstroms per minute and have an index of refraction of between 1.377 and 1.406 (these indices of refraction increase with time when exposed to air). Films were analyzed by infrared spectroscopy and depth X-ray photoelectron spectroscopy (ESCA), as reported in FIGS. 1 and 2.

The growth of acceptable $SiO_pF_q$ films with dielectric constants lower than $SiO_2$ can be determined by measuring the film's index of refraction, which is known to provide an approximate direct relationship to dielectric constant. The index of refraction is also inversely proportional to the fluorine content of the films. The index of refraction test is a simple way to determine the higher fluorine content of the films. The fluorine content has been reported to lower the dielectric constant of the film, see M. B. Anand, et al. VMIC Conference Proceedings, June 1994, pp. 15–21. The refractive index measurements were made at 632 nanometers.

The process of the present invention using the described sources has three advantages:

i) These are fluorinated-alkylsilanes which have very high vapor pressures and have direct silicon-fluorine and silicon-carbon bonds. The high vapor pressures of these compounds will help in easy delivery of the sources into a chemical vapor deposition reactor.

ii) The percent fluorine in the films can be adjusted by an appropriate choice of the source within the context of the general formula set forth above.

We claim:

1. A process for forming a fluorine-containing silicon oxide film on a substrate by plasma-enhanced chemical vapor deposition using a fluorinated silicon source of the formula:

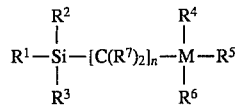

wherein at least one of $R^1$–$R^6$ is fluorine and the remaining R groups are independently H, F, non-fluorinated-, partially fluorinated- or perfluorinated-: alkyl, alkenyl, alkynyl aryl or benzylic groups, or $C_xH_{2x}$ when one or more of $R^1$, $R^2$ or $R^3$ is connected to $R^4$, $R^5$ or $R^6$ through a bridging group $C_yH_{2y}$; where x is 1–6, and y is 0–6; where M is Si or C and n is 0–6; and $R^7$ is independently H, F, $C_zH_{2z+1}$ where z is 1–6 or $C_rH_sF_t$ where r is 1–6, s is (2r+1–t); t is 1 to (2r+1).

2. The process of claim 1 wherein at least one of $R^1$–$R^6$ is fluorine and the remaining R groups are independently H, F, $C_xH_{2x+1}$, $C_rH_sF_t$, $C_6H_5$, or $C_xH_{2x}$ when one or more of $R^1$, $R^2$ or $R^3$ is connected to $R^4$, $R^5$ or $R^6$ through a bridging group $C_yH_{2y}$; where x is 1–6, r is 1–6, s is (2r+1–t); t is 1 to (2r+1) and y is 0–6.

3. The process of claim 1 wherein said fluorinated silicon source is a composition of the formula:

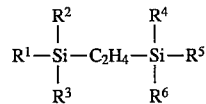

wherein at least one of $R^1$–$R^6$ is fluorine and the remaining R groups are independently H, F, $C_xH_{2x+1}$, $C_rH_sF_t$, where x is 1–6, r is 1–6, s is (2r+1–t), and t is 1 to (2r+1).

4. The process of claim 1 wherein said fluorinated silicon source is selected from the group consisting of: $FSi(C_2H_5)_3$; $F_2Si(C_2H_5)_2$; $F_2Si(CH_3)CH_2CH_2Si(CH_3)F_2$; $F_3SiCH_2CH_2CH(SiF_3)C_2H_5$; $F_3Si—(CH_2)_u—SiF_3$ where u is 1–6; and $FSiR_2H$ where R is $C_1$–$C_6$ hydrocarbons or mixtures thereof.

5. The process of claim 1 wherein said fluorine-containing silicon oxide film formed comprises $SiO_pF_q$, wherein p=2-q and q=0.03–0.6.

6. The process of claim 1 wherein an oxygen containing compound selected from the group consisting of $N_2O$, $O_3$ and $O_2$ is utilized as a reactant in said plasma-enhanced chemical vapor deposition.

7. The process of claim 6 wherein oxygen is present in ratio of 0.5:1 or greater of said fluorinated silicon source.

8. The process of claim 1 wherein said plasma-enhanced chemical vapor deposition is conducted at a temperature in the range of approximately 50° to 500° C., a pressure of approximately 200 mTorr to 2 Torr, and a plasma power of approximately 0.25 to 2 watts/cm².

9. The process of claim 1 wherein said fluorinated silicon source is introduced into said plasma-enhanced chemical vapor deposition by a process selected from the group consisting of entrainment in an inert carrier gas, vaporization and direct liquid injection.

10. The process of claim 1 wherein said fluorinated silicon source is utilized in combination with other silicon sources.

11. A fluorine-containing silicon oxide film supported on a substrate comprising $SiO_pF_q$, wherein p=2-q and q=0.03–0.6, produced by plasma-enhanced chemical vapor deposition using a fluorinated silicon source of the formula:

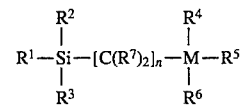

wherein at least one of $R^1$–$R^6$ is fluorine and the remaining R groups are independently H, F, non-fluorinated-, partially fluorinated- or perfluorinated-: alkyl, alkenyl, alkynyl aryl or benzylic groups, or $C_xH_{2x}$ when one or more of $R^1$, $R^2$ or $R^3$ is connected to $R^4$, $R^5$ or $R^6$ through a bridging group $C_yH_{2y}$; where x is 1–6, and y is 0–6; where M is Si or C and n is 0–6; and $R^7$ is independently H, F, $C_zH_{2z+1}$ where z is 1–6 or $C_rH_sF_t$ where r is 1–6, s is (2r+1–t); t is 1 to (2r+1).

12. The film of claim 11 having a index of refraction less than or equal to approximately 1.41 at 632 nm.

13. The composition of matter comprising $F_2Si(CH_3)CH_2CH_2Si(CH_3)F_2$.

14. The composition of matter comprising $F_3SiCH_2CH_2CH_2CH(SiF_3)C_2H_5$.

15. A process for forming a fluorine-containing silicon oxide film on a substrate by plasma-enhanced chemical vapor deposition using a fluorinated silicon source, comprising the steps of:

(a) establishing a plasma by appropriate conditions in a chemical vapor deposition reactor charged with a substrate to be coated;

(b) introducing a fluorinated silicon source and an oxygen containing compound into the reactor;

(c) reacting said fluorinated silicon source with said oxygen containing compound to produce a chemical vapor deposited fluorinated silicon oxide film on said substrate, wherein said fluorinated silicon source has the formula:

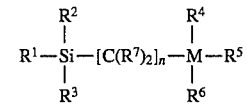

wherein at least one of $R^1$–$R^6$ is fluorine and the remaining R groups are independently H, F, non-fluorinated-, partially fluorinated-or perfluorinated-: alkyl, alkenyl, alkynyl, aryl or benzylic groups, or $C_xH_{2x}$ when one or more of $R^1$, $R^2$ or $R^3$ is connected to $R^4$, $R^5$ or $R^6$ through a bridging group $C_yH_{2y}$; where x is 1–6, and y is 0–6; where M is Si or C and n is 0–6; and $R^7$ is independently H, F, $C_zH_{2z+1}$ where z is 1–6 or $C_rH_sF_t$ where r is 1–6, s is (2r+1–t); t is 1 to (2r+1).

* * * * *